(12) United States Patent
Huang et al.

(10) Patent No.: US 11,901,206 B2
(45) Date of Patent: Feb. 13, 2024

(54) MODULAR PRESSURIZED WORKSTATION

(71) Applicant: Taiwan Semiconductor Manufacturing Co., Ltd., Hsinchu (TW)

(72) Inventors: Chun-Jung Huang, Yunlin County (TW); Yung-Lin Hsu, Hsin-Chu (TW); Kuang Huan Hsu, Hsinchu (TW); Jeff Chen, New Taipei (TW); Steven Huang, Miaoli County (TW); Yueh-Lun Yang, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 18/104,731

(22) Filed: Feb. 1, 2023

(65) Prior Publication Data
US 2023/0178401 A1 Jun. 8, 2023

Related U.S. Application Data

(60) Continuation of application No. 17/317,747, filed on May 11, 2021, now Pat. No. 11,587,811, which is a
(Continued)

(51) Int. Cl.
*H01L 21/677* (2006.01)
*H01L 21/67* (2006.01)

(52) U.S. Cl.
CPC .. *H01L 21/67703* (2013.01); *H01L 21/67196* (2013.01); *H01L 21/67727* (2013.01)

(58) Field of Classification Search
CPC ......... H01L 21/67703; H01L 21/67196; H01L 21/67727
See application file for complete search history.

(56) References Cited

U.S. PATENT DOCUMENTS

| | | | |
|---|---|---|---|
| 5,820,679 | A | 10/1998 | Yokoyama et al. |
| 7,815,739 | B2 | 10/2010 | Matsuura |

(Continued)

FOREIGN PATENT DOCUMENTS

| | | |
|---|---|---|
| JP | H07122622 A | 5/1995 |
| JP | 2001519598 A | 10/2001 |
| WO | 9918603 A1 | 4/1999 |

OTHER PUBLICATIONS

Official Action dated Jan. 21, 2019, in corresponding Taiwan Patent Application No. 10820051740.

*Primary Examiner* — Glenn F Myers
(74) *Attorney, Agent, or Firm* — Duane Morris LLP

(57) ABSTRACT

In an embodiment, a system, includes: a first pressurized load port interfaced with a workstation body; a second pressurized load port interfaced with the workstation body; the workstation body maintained at a set pressure level, wherein the workstation body comprises an internal material handling system configured to move a semiconductor workpiece within the workstation body between the first and second pressurized load ports at the set pressure level; a first modular tool interfaced with the first pressurized load port, wherein the first modular tool is configured to process the semiconductor workpiece; and a second modular tool interfaced with the second pressurized load port, wherein the second modular tool is configured to inspect the semiconductor workpiece processed by the first modular tool.

20 Claims, 8 Drawing Sheets

Related U.S. Application Data division of application No. 15/904,032, filed on Feb. 23, 2018, now Pat. No. 11,011,401.

(60) Provisional application No. 62/591,543, filed on Nov. 28, 2017.

(56) References Cited

U.S. PATENT DOCUMENTS

| | | |
|---|---|---|
| 2001/0051082 A1 | 12/2001 | Kirkpatrick et al. |
| 2003/0051972 A1 | 3/2003 | Davis |
| 2008/0304944 A1 | 12/2008 | Sung et al. |
| 2009/0221217 A1 | 9/2009 | Gajaria et al. |
| 2009/0292388 A1 | 11/2009 | Iimori |
| 2010/0047954 A1 | 2/2010 | Su et al. |

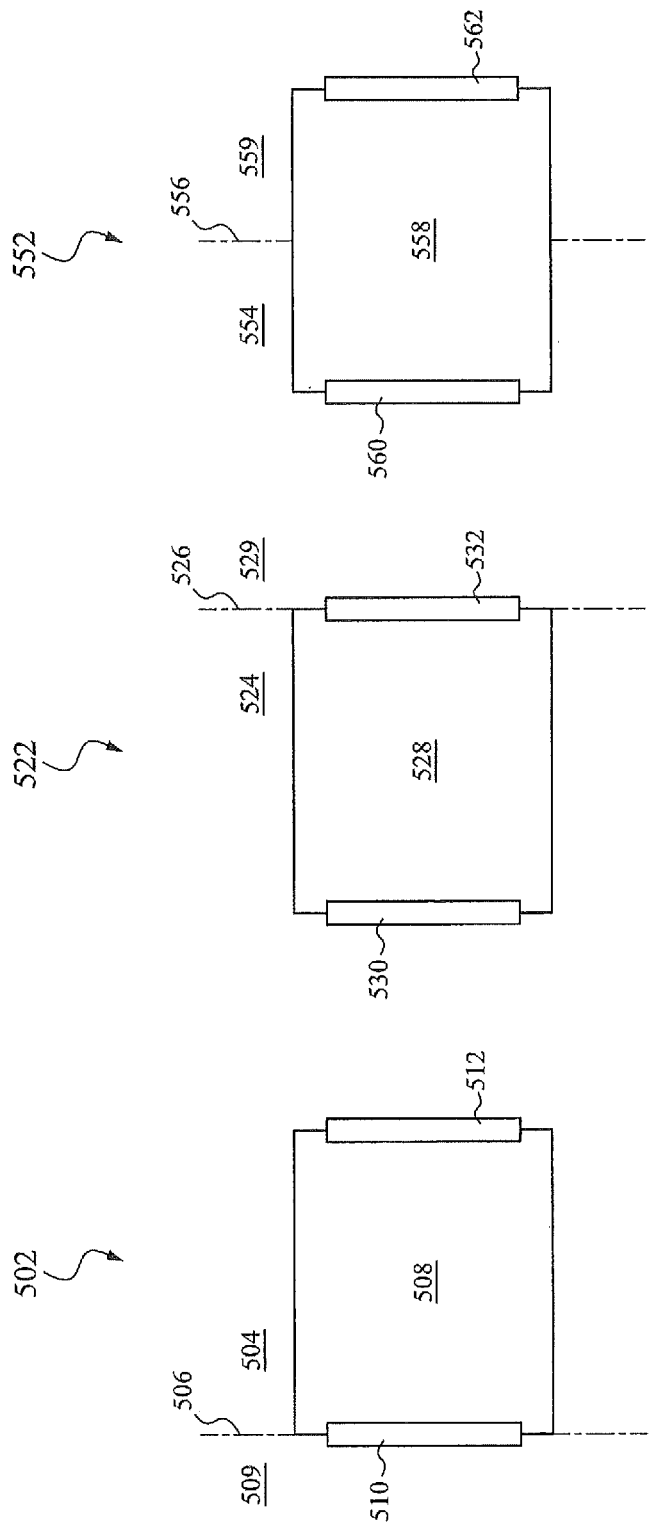

MODULAR PRESSURIZED WORKSTATION

CROSS-REFERENCE TO RELATED APPLICATIONS

This application is a continuation of U.S. patent application Ser. No. 17/317,747, filed May 11, 2021, which is a divisional application of U.S. patent application Ser. No. 15/904,032, filed Feb. 23, 2018, now U.S. Pat. No. 11,011,401, which claims priority to U.S. Application No. 62/591,543, filed Nov. 28, 2017. The contents of each of the above are incorporated by reference in their entireties.

BACKGROUND

Modem assembly line manufacturing processes typically employ automated tools to manipulate materials and devices and create a finished product. These assembly lines may group same tools at a common location or station to manipulate the materials and devices and create a finished product.

Also, current assembly line processes for processing semiconductor workpieces (e.g., wafers or substrates) may manually move and handle the semiconductor workpieces between stations. For example, one or more engineers and/or assembly line operators may move these semiconductor workpieces between stations by hand. Furthermore, tools at these different locations or stations may be spaced apart by significant distances, such as kilometers or miles. Accordingly, movement of these semiconductor workpieces from various stations may constitute a significant manufacturing overhead. Also, these current assembly line processes may be entirely performed at an ambient air pressure that is shared with the tools at the different stations and with the one or more engineers and/or assembly line operators that manually handle the semiconductor workpieces. Such techniques require large amounts of overhead and expensive hardware, but still fail to produce satisfactory results.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 5A is an illustration of a pressurized load port protruding into a modular pressurized workstation body, in accordance with some embodiments.

FIG. 5B is an illustration of a pressurized load port protruding out of a modular pressurized workstation body, in accordance with some embodiments.

FIG. 5C is an illustration of a pressurized load port partially protruding out of a modular pressurized workstation body, in accordance with some embodiments.

DETAILED DESCRIPTION OF EXEMPLARY EMBODIMENTS

Figure 1:
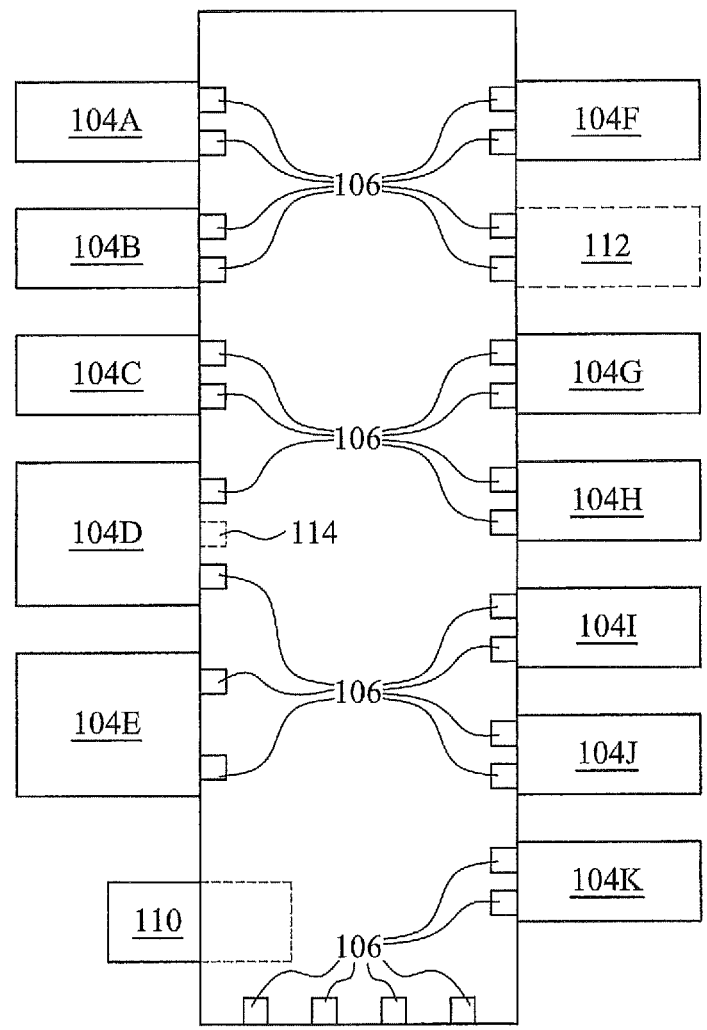
FIG. 1 is an illustration of a modular pressurized workstation, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a modular pressurized work station for semiconductor workpiece processing. The modular pressurized workstation may include an internal material handling system that operates at a consistent atmospheric pressure to transport semiconductor workpieces between various modular tools in the performance of semiconductor processing. These semiconductor workpieces may be embodied as, for example, wafers or substrates. These various modular tools may be vertically integrated by the modular pressurized workstation, such that separate modular tools at separate stations of an assembly line may be integrated together and automated to provide an end-to-end solution (or at least a vertically integrated solution of separate modular tools). Furthermore, this vertical integration for semiconductor processing using the modular pressurized work station may transport semiconductor workpieces at a controlled atmospheric pressure without manual intervention. By being vertically integrated, these tools may be centrally coordinated and controlled to minimize manual intervention and handling of semiconductor workpieces. These modular tools may include any tool that may be utilized in the processing of semiconductor workpieces, such as physical vapor deposition (PVD) tools, chemical vapor deposition (CVD) tools, chemical mechanical planarization (CMP) tools, diffusion (DIF) tools, wet etching tools, dry etching tools, photolithography tools (e.g., G-line, H-line, and/or I-line tools), deep ultraviolet (DUV) tools, after developed inspection (ADI) tools, after etched inspection (AEI) tools, critical dimension (CD) inspection tools, scanning electron microscopes (SEM) tools, critical dimension scanning electron microscope (CD-SEM) tools, overlay (OVL) tools, medium current implantation (MCI) tools, high current implantation (HCl) tools, wet cleaning tools, dry cleaning tool, plasma aching (PR asher) tools, and scatterometry critical dimension (SCD) tools. The functionalities and configurations of each individual modular tool is conventional (e.g., well known) and will not be discussed in detail herein for brevity. However, as discussed further below, these modular tools may feature structures such as a material handling system for each modular tool to transfer semiconductor workpieces to and from a workstation body.

As discussed further below, in certain embodiments, some of these modular tools may be classified as either of a processing tool, inspection tool, and cleaning tool. For example, processing tools may facilitate the processing of semiconductor workpieces. Examples of processing tools may include PVD tools, CVD tools, CMP tools, DIF tools, wet etching tools, dry etching tools, photolithography tools (e.g., G-line, H-line, and/or I-line tools), and DUV tools. Inspection tools may facilitate inspection of a semiconductor workpiece for defects. Examples of these inspection tools may include ADI tools, AEI tools, CD inspection tools, SEM tools, CD-SEM tools, OVL tools. Cleaning tools may facilitate cleaning of undesirable artifacts resulting from operation of processing or inspection tools upon a semiconductor workpiece. Examples of cleaning tools may include wet cleaning tools, dry cleaning tools, and PR asher tools.

The modular pressurized workstation may include pressurized load ports. These pressurized load ports may interface with a workstation body, which is maintained at a consistent atmospheric pressure. Via the pressurized load ports, the modular pressurized workstation body may interface with an environment differently pressurized than the consistent atmospheric pressure of the workstation body. For example, the modular pressurized workstation body may interface with a modular tool or an external material handling system, either of which may be at a different atmospheric pressure than the consistent atmospheric pressure of the workstation body. As introduced above, an internal material handling system may be internal to the workstation body. Accordingly, semiconductor workpieces handled by the internal material handling system may be handled at the consistent atmospheric pressure of the workstation body. The internal material handling system may be any type of automated materials handing (AMH) system, but operated at a consistent atmospheric pressure and configured to move semiconductor workpieces between pressurized load ports. These internal handling systems may include any of a variety of robots, sorters, conveyors, rails, carriers, belts, chutes, pulleys, or overhead hoist transportation systems, and the like to transport a single semiconductor workpiece or multiple semiconductor workpieces as part of a pod (e.g., a front opening unified or universal pod (FOUP)) or other container for a semiconductor workpiece. In certain embodiments, the mechanics and exact implementation of the internal handling systems may be conventional (e.g., utilized with conventional components and arranged in a conventional manner) that will not be discussed in detail herein for brevity. However, such internal handling systems may be operationally modified to work within the workstation body. For example, a material handling system (whether an internal material handling system, an external material handling system, or a material handling system of a modular tool) may include robots, conveyor belts, or rails that may be configured move a semiconductor workpiece to and from different pressurized load ports.

A pressurized load port may include an intermediate chamber between two doors (e.g., portals). One of the doors may be between the intermediate chamber and the outside of the workstation body, and be termed as an external door. The other door may be between the internal chamber and the workstation body, and be termed as an internal door. The intermediate chamber may be utilized to equalize atmospheric pressure when transitioning a semiconductor workpiece to and from the workstation body. As will be discussed further below, this transition may be facilitated by placing the semiconductor workpiece within the chamber. Both the external and internal doors may be closed while the chamber is sealed, pending a change of atmospheric pressure in the chamber. Then either the external or the internal door may be opened based on whether the atmospheric pressures is changed to the consistent atmospheric pressure of the workstation body (to open the internal door) or an external atmospheric pressure outside of the workstation body (to open the external door). In certain embodiments, after opening the internal door, the internal door may remain open until a semiconductor workpiece is to be transferred out of the workstation body. By keeping the internal door open, overhead (e.g., power consumption) may be reduced as the internal door need not be reopened each time a semiconductor workpiece is to be transferred out of the workstation body. Accordingly, the chamber may be open to (e.g., continuous with) the workstation body when the chamber is at the consistent atmospheric pressure of the workstation body. For example, the internal door may be open and the external door may be closed when the chamber is at the consistent atmospheric pressure of the workstation body. Also, the chamber may not be open to the workstation body when the chamber is not at the consistent atmospheric pressure of the workstation body. For example, the internal door may be closed when the chamber is not at the consistent atmospheric pressure of the workstation body.

In various embodiments, the various modular tools that interface with the workstation body via the pressurized load ports may be removably attached and modularly configured to be part of the modular pressurized workstation that includes the modular pressurized workstation body and any modular tools interfacing (e.g., attached) to the modular pressurized workstation body. For example, while attached to (e.g., interfaced with) the workstation body, a modular tool may be considered to be part of the modular pressurized workstation. However, the modular tool may be considered to not be part of the modular pressurized workstation when not attached to the workstation body. Also, by being attached, the modular tool may be interfaced to either receive or give a semiconductor workpiece to a workstation body via a pressurized load port. For example, the modular tool may be interfaced by having a robot move a semiconductor workpiece between the modular tool and the pressurized load port.

Advantageously, the consistent atmospheric pressure of the workstation body may be less than 1 Atm. In certain embodiments, the consistent atmospheric pressure of the workstation body may be from about $10^{-1}$ Torr to about $10^{-3}$ Torr. In various embodiment, the lower the atmospheric pressure of the workstation body, the better the particle performance of the workstation body (e.g., fewer particles per given volume of space, and fewer particles that may undesirably deposit on a semiconductor workpiece during semiconductor processing). Furthermore, by vertically integrating (e.g., daisy chaining) multiple modular tools with a workstation body, manufacturing cycle time may be reduced as the various tools may be placed closer together than if the tools were in separate facilities (e.g., separate stations) or were farther apart. Also, by vertically integrating multiple modular tools with a workstation body, power consumption may be reduced as the tools may be closer together than if the materials were farther apart.

FIG. 1 is an illustration of a modular pressurized workstation 100, in accordance with some embodiments. The modular pressurized workstation 100 may have a workstation body 102 and various modular tools 104A-104K interfaced with the workstation body 102. Each of the modular tools may have respective pressurized load ports 106 from which the modular tools may move semiconductor workpieces to and from the workstation body 102. In addition, the modular pressurized workstation 100 may interface with an external material handling system 108. Specifically, the workstation body 102 may interface with the external material handling system 108 via the pressurized load ports 106 between the external material handling system 108 and the workstation body 102. In certain embodiments, the modular pressurized workstation may have a sorter 110 that may store and sort semiconductor workpieces. The sorter 110 may provide a buffering space for work in progress semiconductor workpieces being transported by the internal material handling system. In certain embodiments, the sorter may be part of (e.g., within) the workstation body 102.

By being modular, one of the modular tools 104A-104K may be added or removed from the modular pressurized workstation 100 to replace another of the modular tools 104A-104K. For example, a number of the pressurized load ports 106 may not be interfaced with one of the connected modular tools 104A-104K. However, the pressurized load ports 106 that are unused may, if desired, be interfaced with a removed (e.g., not currently connected) modular tool within a modular tool location 112 (shown in phantom). The modular tool location may be a footprint for a modular tool when interfaced with the workstation body 102. In other words, the removed modular tool may rest in the modular tool location 112 when interfaced with the workstation body 102.

Also, although each modular tool 104A-104K is illustrated with two pressurized load ports, the workstation body 102 may interface with a modular tool via any number (e.g., one or more) pressurized load ports for different applications in accordance with various embodiments. For example, the modular tool 104D may interface with the workstation body 102 using a third load port (illustrated in phantom). Furthermore, the modular tools 104A-104K need not all be uniform, and some modular tools may be larger or smaller (e.g., have smaller or larger footprints) than other modular tools. For example, modular tools 104D and 104E may be larger than the other modular tools 104A-104C and 104F-104K.

In certain embodiments, each of the modular tools 104A-104K may be unique and provide a different type of process for the semiconductor processing of semiconductor workpieces. However, in other embodiments, a number of the modular tools 104A-104K may be the same (with at least some differentiation between the entire set of modular tools 104A-104K interfaced with the workstation body 102). For example, modular tool 104A may be an OVL, modular tool 104B may be a CD-SEM, modular tool 104C may be a ADI, modular tool 104F may be a photolithography tool, modular tool 104G may be a PR asher tool, modular tool 104H may be a wet cleaning tool, and modular tool 104I may be a MCI.

Also, modular tools 104D and 104E may be DUVs and modular tools 104J and 104K may be HCIs. Each of these modular tools are discussed above.

Figure 2:
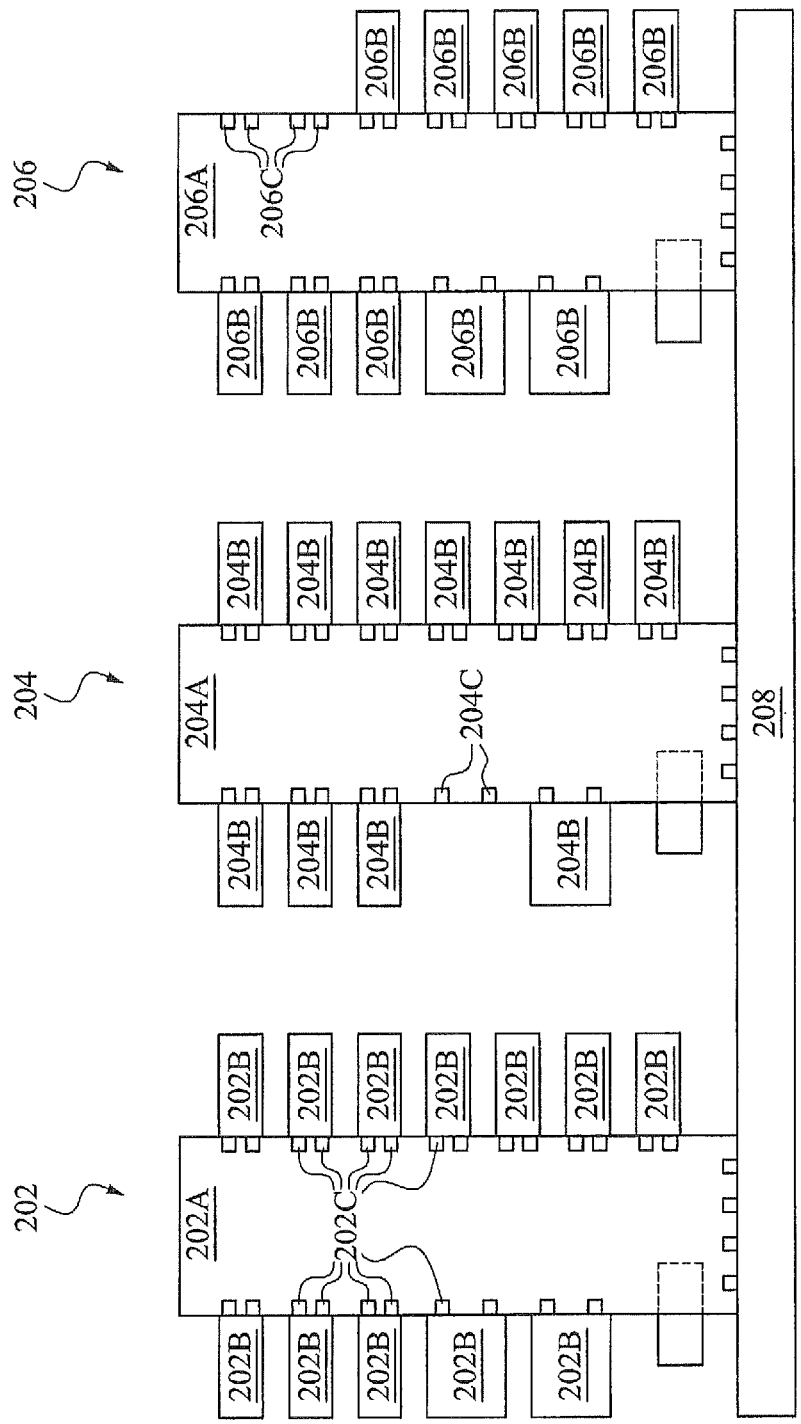
FIG. 2 is an illustration of multiple modular pressurized workstations connected by an external material handling system, in accordance with some embodiments.

FIG. 2 is an illustration of multiple modular pressurized workstations 202, 204, and 206 connected by an external material handling system 208, in accordance with some embodiments. Accordingly, multiple modular pressurized workstations may transfer semiconductor workpieces amongst themselves using the external material handling system 208. Also, each of the multiple modular pressurized workstations 202, 204, and 206 may have a different configuration and/or number of modular tools interfaced with their respective workstation body. For example, the modular pressurized workstation 202 may have a work station body 202A with the maximum number of modular tools 202B interfaced with the workstation body 202A (e.g., with all pressurized load ports 202C interfaced between one of the modular tools 202B and the workstation body 202A). Additionally, the workstation body 204A of the modular pressurized workstation 204 may be interfaced with a number of modular tools 204B. However, one set of pressurized load ports 202C, that would be interfaced with a single modular tool, is not interfaced with any of the modular tools 204B. Also, the workstation body 206A of the modular pressurized workstation 206 may be interfaced with a number of modular tools 206B. However, two sets of two pressurized load ports 206C (where each set would be interfaced with a single modular tool) is not interfaced with any of the modular tools 206B. Although two pressurized load ports are illustrated for interfacing between a modular tool and a workstation body, any number of pressurized load ports may be utilized to interface between a modular tool and a workstation body in different applications of various embodiments. For example, in certain embodiments, only one pressurized load port may be used to interface a between a modular tool and a workstation body.

Figure 3:
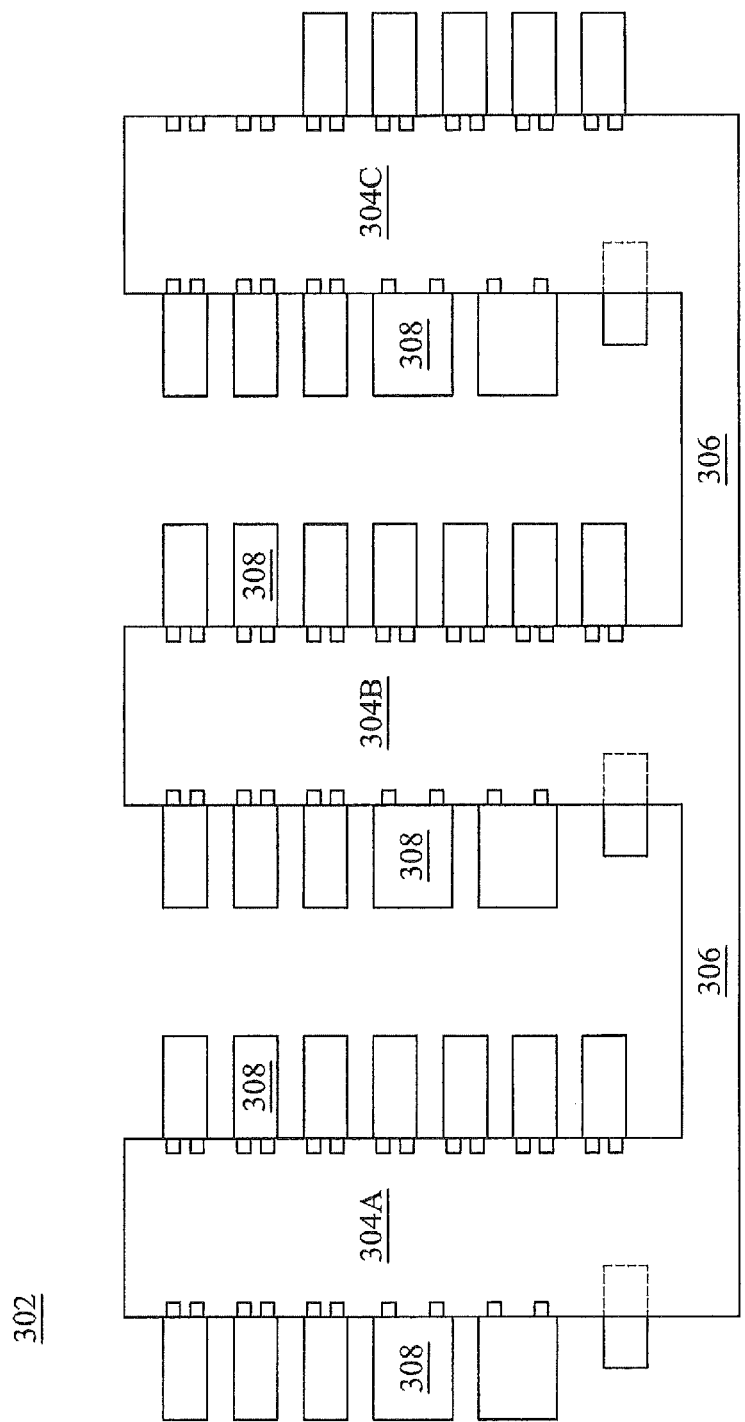
FIG. 3 is an illustration of a modular pressurized workstation with multiple wings, in accordance with some embodiments.

FIG. 3 is an illustration of a modular pressurized workstation 302 with multiple wings 304A, 304B, 304C, in accordance with some embodiments. Each of the modular wings may be connected by part of the internal material handling system 306 that sits within the workstation body of the modular pressurized workstation 302 between each of the multiple wings 304A, 304B, and 304C. Accordingly, each of the modular wings may be continuous (e.g., be connected) and be at a consistent atmospheric pressure. Furthermore, some of the wings may be connected with a same number of modular tools, while other wings may be connected with a differing number of modular tools. For example, wings 304A and 304B may have a same number of connected modular tools 308 while wing 304C may have fewer number of connected modular tools 308.

Figure 4:
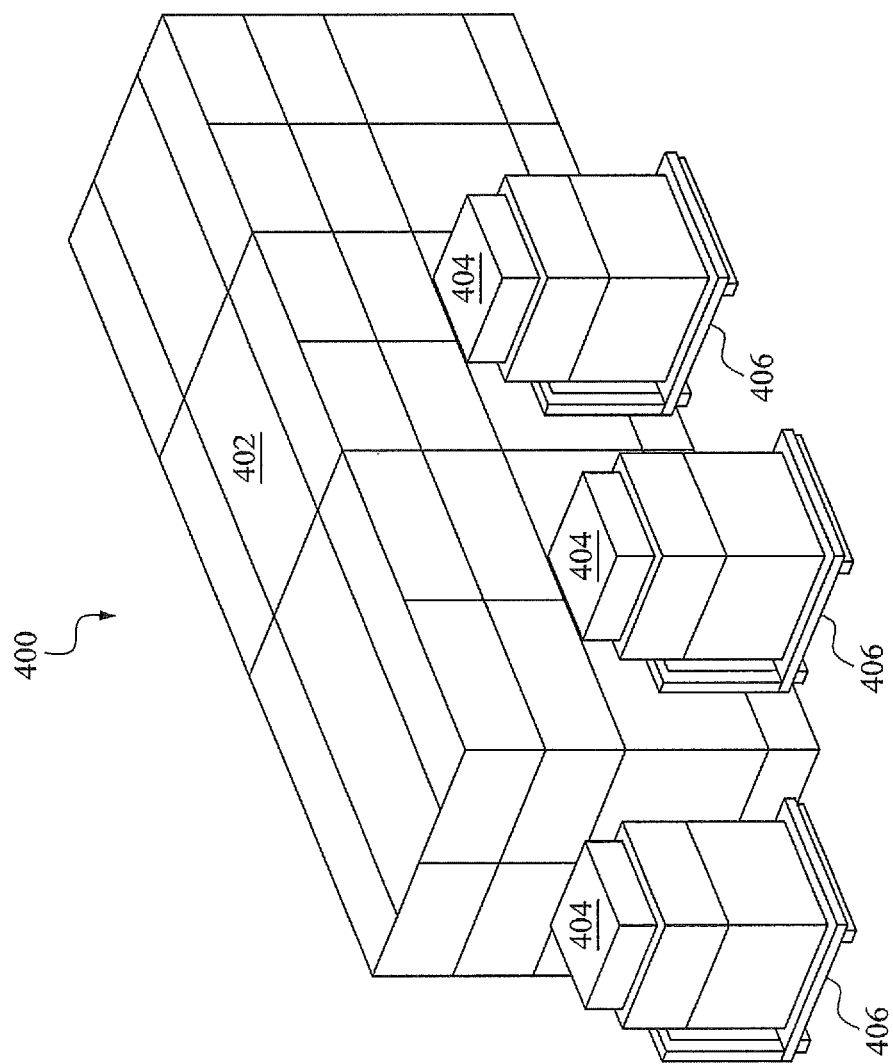
FIG. 4 is a perspective view of a modular pressurized workstation, in accordance with some embodiments.

FIG. 4 is a perspective view of a modular pressurized workstation 400, in accordance with some embodiments. The modular pressurized workstation may include a workstation body 402 connected with (e.g., interfacing with) multiple modular workstations 404. In certain embodiments, the modular workstations 404 may rest on transportation platforms 406. The transportation platforms 406 may include wheels along the bottom or may be connected with an external material handling system in order to move to and interface with the workstation body 204A or to move from and disengage from the workstation body 204A.

FIG. 5A is an illustration of a pressurized load port 502 protruding into a modular pressurized workstation body region, in accordance with some embodiments. By protruding into the modular pressurized workstation body region, the pressurized load port 502 may be substantially on the inside 504 of the workstation body region outlined by a workstation body wall 506 (illustrated in dotted lines). By being substantially on the inside 504, the pressurized load port 502 may have its chamber 508 wholly protruding into the workstation body region outlined by the workstation body wall 506. This may contrast with being outside 509 of the workstation body region outlined by the workstation body wall 506. The pressurized load port 502 may have an external door 510 between the chamber and the outside 509 and an internal door 512 between the chamber 508 and the inside 504 of the workstation body wall 506. A method of operating a pressurized load port will be discussed further below in connection with FIG. 7.

FIG. 5B is an illustration of a pressurized load port 522 protruding out of a modular pressurized workstation body region, in accordance with some embodiments. By protruding out of the modular pressurized workstation body region, the pressurized load port 522 may be substantially on the outside 524 of the workstation body region outlined by a workstation body wall 526 (illustrated in dotted lines). By being substantially on the outside 524, the pressurized load port 522 may have its chamber 528 wholly outside of the workstation body region outlined by the workstation body wall 526. This may contrast with being inside 529 of the workstation body region outlined by the workstation body wall 526. The pressurized load port 522 may have an external door 530 between the chamber and the outside 524 and an internal door 532 between the chamber 528 and the inside 529 of the workstation body wall 526. As mentioned above, a method of operating a pressurized load port will be discussed further below in connection with FIG. 7.

FIG. 5C is an illustration of a pressurized load port 552 partially protruding out of a modular pressurized workstation body region, in accordance with some embodiments. By partially protruding out of the modular pressurized workstation body region, the pressurized load port 552 may be partially on the outside 554 of the workstation body region outlined by a workstation body wall 556 (illustrated in dotted lines). By being partially on the outside 554, the pressurized load port 552 may have its chamber 558 partially outside of the workstation body region outlined by the workstation body wall 556. Also, by being partially on the outside 554, the pressurized load port 552 may have its chamber 558 partially inside 559 of the workstation body region outlined by the workstation body wall 556. The pressurized load port 552 may have an external door 560 between the chamber 558 and the outside 554 of the workstation body region and an internal door 562 between the chamber 558 and the inside 559 of the of the workstation body region. As mentioned above, a method of operating a pressurized load port will be discussed further below in connection with FIG. 7.

Figure 6:
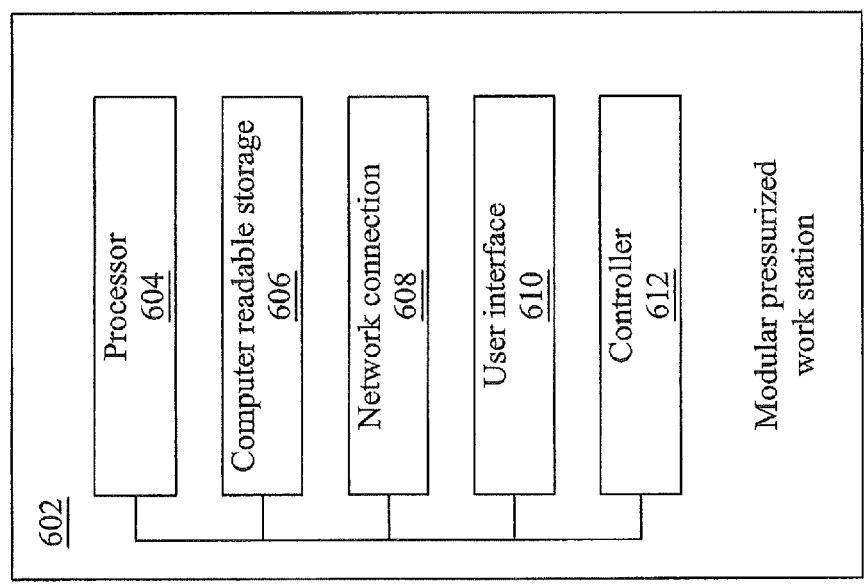
FIG. 6 is a block diagram of various functional modules of a modular pressurized workstation, in accordance with some embodiment.

As discussed above, a chamber of a pressurized load port may open to (e.g., continuous with) the workstation body when the chamber is at the consistent atmospheric pressure of the workstation body. For example, the internal door may be open and the external door may be closed when the chamber is at the consistent atmospheric pressure of the workstation body. Also, the chamber may not be open to the workstation body when the chamber is not at the consistent atmospheric pressure of the workstation body. For example, the internal door may be closed when the chamber is not at the consistent atmospheric pressure of the workstation body. FIG. 6 is a block diagram of various functional modules of a modular pressurized workstation 602, in accordance with some embodiments. The modular pressurized workstation 602 may include a processor 604. In further embodiments, the processor 604 may be implemented as one or more processors. The processor 604 may be operatively connected to a computer readable storage module 606 (e.g., a memory and/or data store), a network connection module 608, a user interface module 610, a controller module 612. In some embodiments, the computer readable storage module 606 may include modular pressurized workstation process logic that may configure the processor 304 to perform the various processes discussed herein (e.g., a pressurized load port operation process, a modular pressurized workstation transfer process, and a modular pressurized workstation semiconductor processing process). The computer readable storage may also store parameter data, such as semiconductor workpiece data, modular tool data, internal material handling system data, and modular pressurized workstation data, and any other parameter or information that may be utilized to perform the various processes discussed herein.

The network connection module 608 may facilitate a network connection of the modular pressurized workstation 602 with the various devices and components of a modular pressurized workstation 602. These devices and components may include the various possible modular tools and external material handling systems that may interface with the workstation body. In certain embodiments, the network connection module 606 may facilitate a physical connection, such as a line or a bus. In other embodiments, the network connection module 606 may facilitate a wireless connection, such as over a wireless local area network (WLAN) by using a transmitter, receiver, and/or transceiver.

The modular pressurized workstation 602 may also include the user interface module 610. The user interface module 610 may include any type of interface for input and/or output to an operator of the modular pressurized workstation 602, including, but not limited to, a monitor, a laptop computer, a tablet, or a mobile device, etc.

The modular pressurized workstation 602 may include a controller module 612. The controller module 612 may be configured to control various physical apparatuses that control movement of a modular tool, internal material handling system, and modular pressurized workstation, as discussed above. For example, the controller module 612 may control a motor of the internal material handling system that moves a semiconductor workpiece between pressurized load ports. The controller may be controlled by the processor and may carry out the various aspects of the pressurized load port operation process, modular pressurized workstation transfer process, and modular pressurized workstation semiconductor processing process, as will be discussed further below.

Figure 7:
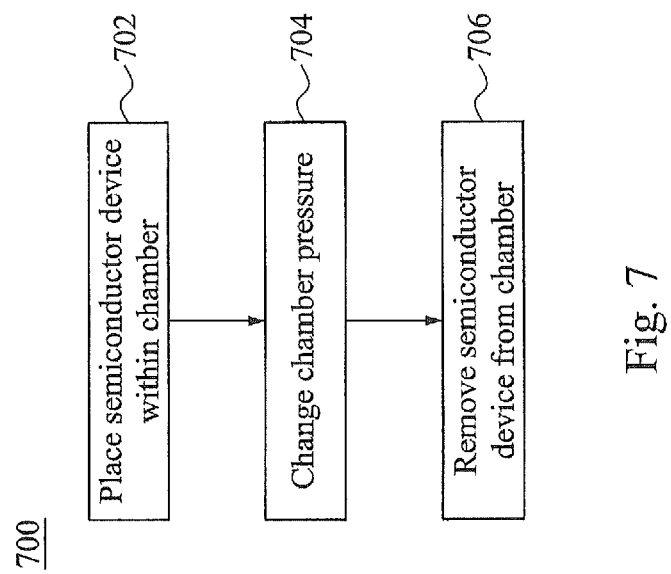
FIG. 7 is a flow chart of a pressurized load port operation process, in accordance with some embodiments.

FIG. 7 is a flow chart of a pressurized load port operation process 700, in accordance with some embodiments. The pressurized load port operation process 700 may be performed by a load port in conjunction with the various functional modules of the modular pressurized workstation, as discussed above. As introduced above, a load port may include a chamber that may be utilized to equalize atmospheric pressure when transitioning a semiconductor workpiece to and from the inside of a workstation body. It is noted that the process 700 is merely an example, and is not intended to limit the present disclosure. Accordingly, it is understood that additional operations may be provided before, during, and after the process 700 of FIG. 7, certain operations may be omitted, certain operations may be performed concurrently with other operations, and that some other operations may only be briefly described herein.

Accordingly, at block 702, the semiconductor workpiece may be placed within the chamber. The semiconductor workpiece may be placed in the chamber as part of a pod (e.g., a FOUP, discussed above). The semiconductor workpiece may be placed in the chamber due to either one of the internal or external doors being open and the other closed. For example, when transitioning a semiconductor workpiece from the workstation body, the internal door may be open while the external door may be closed. Alternatively, when transitioning a semiconductor workpiece to a workstation body from a modular tool, the external door may be open and the internal door may be closed.

At block 704, the atmospheric pressure in the chamber may be changed. Both the external and internal doors may be closed while the chamber is sealed pending a change of atmospheric pressure in the chamber. The atmospheric pressure may be changed using a pump or other device that pumps more air into or out of the chamber to change the atmospheric pressure in the chamber as desired.

At block 706, the semiconductor workpiece may be removed from the chamber. To allow for removal, either the external or the internal door may be opened based on whether the atmospheric pressures is changed to the consistent atmospheric pressure of the workstation body (to open the internal door) or the external atmospheric pressure outside of the workstation body (to open the external door). In certain embodiments, after opening the internal door, the internal door may remain open until a semiconductor workpiece is to be transferred out of the workstation body. By keeping the internal door open, overhead (e.g., power consumption) may be reduced as the internal door need not be reopened each time a semiconductor workpiece is to be transferred out of the workstation body.

Figure 8:
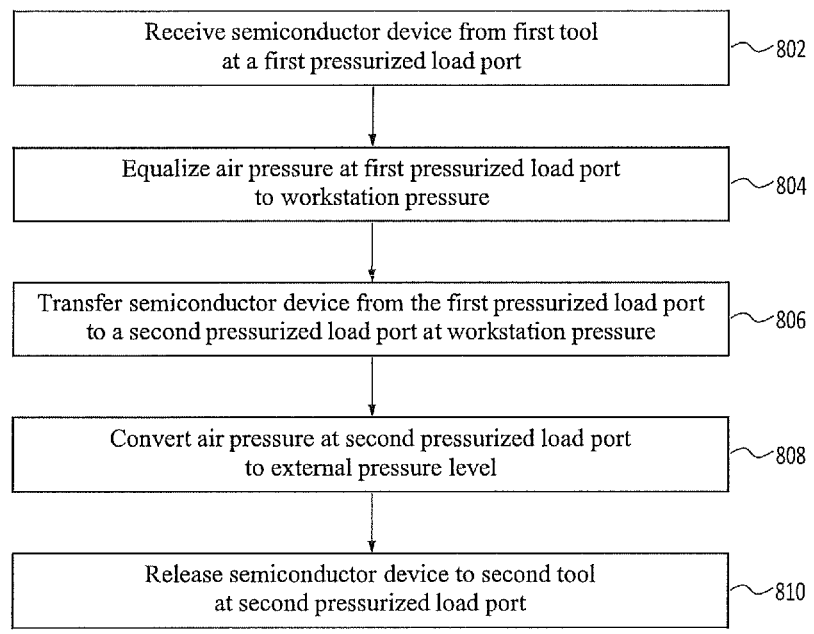
FIG. 8 is a flow chart of a modular pressurized workstation transfer process, in accordance with some embodiments.

FIG. 8 is a flow chart of a modular pressurized workstation transfer process 800, in accordance with some embodiments. The modular pressurized workstation transfer process 800 may be performed by a load port and internal material handling system in conjunction with the various functional modules of the modular pressurized workstation, as discussed above. It is noted that the process 800 is merely an example, and is not intended to limit the present disclosure. Accordingly, it is understood that additional operations may be provided before, during, and after the process 800 of FIG. 8, certain operations may be omitted, certain operations may be performed concurrently with other operations, and that some other operations may only be briefly described herein.

At block 802, a semiconductor workpiece may be received from a first modular tool at a first pressurized load port. The semiconductor workpiece may be received by being loaded onto the first pressurized load port while the external door of the first pressurized load port is open. The semiconductor workpiece may be loaded onto the first pressurized load port in a chamber of the first pressurized load port. The semiconductor workpiece may be loaded by being moved (e.g., by a material handling system, such as by a robot of the material handling system) into the chamber. For example, each modular tool may have its own material handling system that may be configured to transfer semiconductor workpieces between itself (e.g., the modular tool itself) and the chamber.

At block 804, the air pressure in the chamber may be equalized to the consistent atmospheric pressure internal to a workstation body. The air pressure may be equalized by closing both the internal and external doors of the first pressurized load port and changing the pressure in the chamber to the consistent atmospheric pressure internal to the workstation body.

At block 806, the semiconductor workpiece may be transferred from the first pressurized load port to a second pressurized load port. This transfer may be performed by an internal material handling system within the workstation body. Accordingly, this transfer may be performed at the consistent atmospheric pressure internal to the workstation body. Specifically, the semiconductor workpiece may be transferred to a chamber of the second pressurized load port.

At block 808, the air pressure in the chamber of the second pressurized load port may be converted to the atmospheric pressure level at the second modular tool. The air pressure may be equalized by closing both the internal and external doors of the second pressurized load port and changing the pressure in the chamber of the second pressurized load port to the atmospheric pressure level at the second modular tool.

At block 810, the semiconductor workpiece may be released from the second pressurized load port for receipt by the second modular tool. The semiconductor workpiece may be released by opening the external door of the second pressurized load port for access by the second modular tool. In certain embodiments, the material handling system of the second modular tool may transport the semiconductor workpiece from the chamber of the second pressurized load port to the second modular tool.

Figure 9:
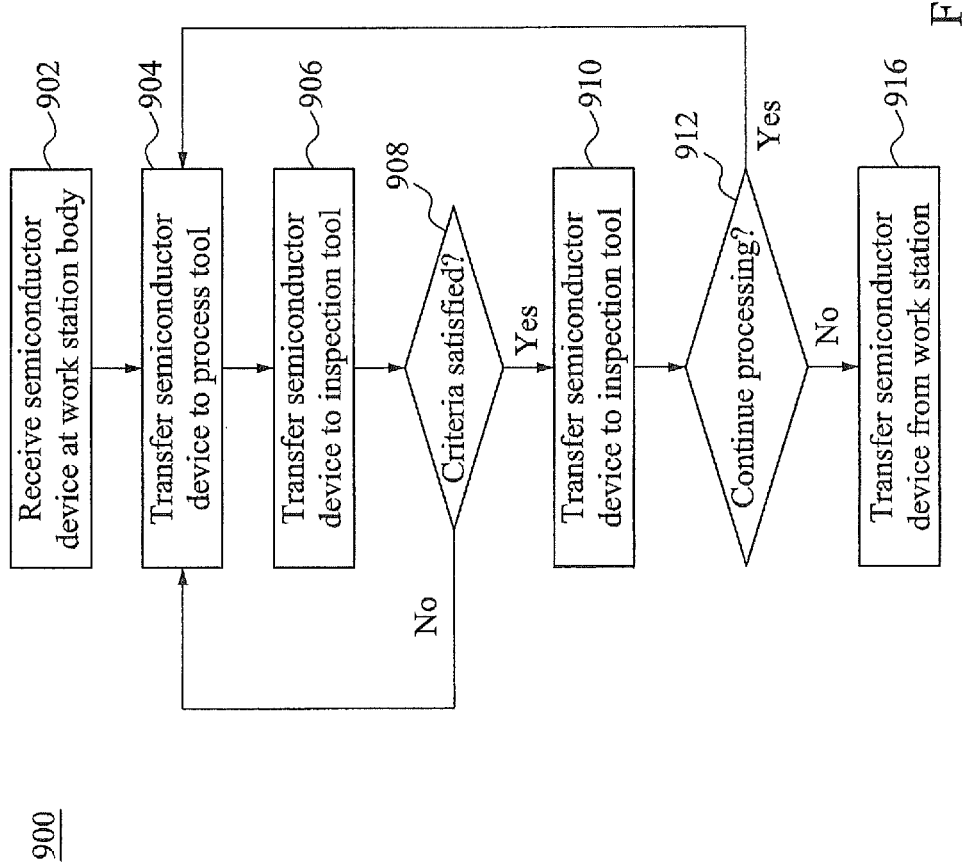
FIG. 9 is a flow chart of a modular pressurized workstation semiconductor processing process, in accordance with some embodiments.

FIG. 9 is a flow chart of a modular pressurized workstation semiconductor processing process 900, in accordance with some embodiments. The modular pressurized workstation semiconductor processing process 900 may be performed by a modular pressurized workstation utilizing pressurized load ports, an internal material handling system and various modular tools (e.g., a processing tool, inspection tool, and cleaning tool) in conjunction with the various functional modules of the modular pressurized workstation, as discussed above. It is noted that the process 900 is merely an example, and is not intended to limit the present disclosure. Accordingly, it is understood that additional operations may be provided before, during, and after the process 900 of FIG. 9, certain operations may be omitted, certain operations may be performed concurrently with other operations, and that some other operations may only be briefly described herein.

At block 902, a modular pressurized workstation may receive a semiconductor workpiece at a workstation body. In certain embodiments, the semiconductor workpiece may be received at the workstation body via an external material handling system. This external material handling system may transfer the semiconductor workpiece to the workstation body via a pressurized load port, discussed further above.

At block 904, the modular pressurized workstation may transfer the semiconductor workpiece to a modular tool that is a processing tool. As discussed above, processing tools may facilitate the processing of semiconductor workpieces. Examples of processing tools may include PVD tools, CVD tools, CMP tools, DIF tools, wet etching tools, dry etching tools, photolithography tools (e.g., G-line, H-line, and/or I-line tools), and DUV tools. This, and all transfers in a workstation body, may be made via an internal material handling system at the consistent atmospheric pressure internal to the workstation body. Also, this transfer may be made to a pressurized load port at the interface between the workstation body and the specific modular tool (e.g., the processing tool) as discussed further above.

At block 906, the modular pressurized workstation may transfer the semiconductor workpiece to a modular tool that is an inspection tool. As discussed above, inspection tools may facilitate inspection of a semiconductor workpiece for defects. Examples of these inspection tools may include ADI tools, AEI tools, CD inspection tools, SEM tools, CD-SEM tools, OVL tools. This transfer may be performed by the modular pressurized workstation retrieving the semiconductor workpiece from an appropriate pressurized load port after processing by a specific modular tool (e.g., the processing tool). As introduced above, modular tools (e.g., the processing tool) may return the semiconductor workpiece after performance of a particular process specific to the modular tool.

At block 908, the modular pressurized workstation may make a decision as to whether a criteria is satisfied based on the inspection of the inspection tool. This decision may be made based on information produced by the inspection tool and processed by the processor of the modular pressurized workstation. The criteria may be any type of criteria or parameter value as detectible by the inspection tool. For example, the criteria may be whether the results as measured by the inspection tool are within regulatory limits. As another example, the criteria may be whether the semiconductor workpiece has a specific structural feature as expected after processing by the processing tool (e.g., whether an expected process such as doping or etching has satisfactorily occurred at the semiconductor workpiece). If the criteria is not satisfied, the process may return to block 904, and the semiconductor workpiece may be transferred back to a processing tool for reworking. In certain embodiments, this processing tool may be different than the processing tool previously utilized. In further embodiments, this processing tool may be the same as the processing tool previously utilized. If the criteria is satisfied, the process may proceed to block 910.

At block 910, the modular pressurized workstation may transfer the semiconductor workpiece to a modular tool that is a cleaning tool. As discussed above, cleaning tools may facilitate cleaning of undesirable artifacts resulting from operation of processing or inspection tools upon a semiconductor workpiece. Examples of cleaning tools may include wet cleaning tools, dry cleaning tools, and PR asher tools.

At block 912, the modular pressurized workstation may make a decision as to whether semiconductor processing at the modular pressurized workstation is to continue. This decision may be made based on instructions stored in the modular pressurized workstation's computer readable storage or received by the modular pressurized workstation's network connection or user interface. Alternatively, this decision may be made based on data gathered during the processing of the semiconductor workpiece (e.g., which processing tools have been utilized or how long the semiconductor workpiece has been undergoing processing). If semiconductor processing is not to continue, the process 900 may proceed to block 916. If semiconductor processing is to continue, the process 900 may proceed to block 904, where the semiconductor workpiece is transferred to a processing tool for processing. This processing tool may be different than the processing tool previously utilized and/or may be a same processing tool as previously utilized but that is performing a modified process (e.g., a same process but on a different part of the semiconductor workpiece) relative to the process previously performed.

At block 916, the modular pressurized workstation may transfer the semiconductor workpiece from the workstation body. In certain embodiments, the modular pressurized workstation may transfer the semiconductor workpiece to an external material handling system for processing outside of the modular pressurized workstation.

In an embodiment, a system, includes: a first pressurized load port interfaced with a workstation body; a second pressurized load port interfaced with the workstation body; the workstation body maintained at a set pressure level, wherein the workstation body comprises an internal material handling system configured to move a semiconductor workpiece within the workstation body between the first and second pressurized load ports at the set pressure level; a first modular tool interfaced with the first pressurized load port, wherein the first modular tool is configured to process the semiconductor workpiece; and a second modular tool interfaced with the second pressurized load port, wherein the second modular tool is configured to inspect the semiconductor workpiece processed by the first modular tool.

In another embodiment, a system, includes: a first pressurized load port interfaced with a workstation body, and a second pressurized load port interfaced with the workstation body; the workstation body maintained at a set pressure level, wherein the workstation body comprises an internal material handling system configured to move a semiconductor workpiece within the workstation body between the first and second pressurized load ports at the set pressure level; a first modular tool interfaced with the first pressurized load port; and a second modular tool interfaced with the second pressurized load port.

In another embodiment, a method includes: receiving a semiconductor workpiece from a processing tool at a first pressurized load port, wherein the processing tool is configured to process the semiconductor workpiece; converting air pressure in the first pressurized load port to equalize with a set pressure level; transferring, in an environment at the set pressure level, the semiconductor workpiece from the first pressurized load port to a second pressurized load port; converting air pressure in the second pressurized load port to an external pressure level; releasing the semiconductor workpiece from the second pressurized load port to an inspection tool, wherein the inspection tool is configured to inspect the semiconductor workpiece for defects from processing by the processing tool.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
    a processing tool configured to process a semiconductor workpiece;
    a first pressurized load port configured to receive the semiconductor workpiece from the processing tool, wherein an air pressure in the first pressurized load port is equalized with a set pressure level;
    a second pressurized load port configured to receive the semiconductor workpiece from the first pressurized load port, wherein the second pressurized load port is set at the set pressure level when receiving the semiconductor workpiece from the first pressurized load port and thereafter set to an external air pressure; and
    an inspection tool configured to receive the semiconductor workpiece from the second pressurized load port, wherein the inspection tool is configured to inspect the semiconductor workpiece for defects from processing by the processing tool.

2. The system of claim 1, wherein the first and second pressurized load ports each comprise a chamber between a first door and a second door, wherein only one door is configured to be open at any time.

3. The system of claim 1, wherein the set pressure level is less than a standard atmosphere (atm).

4. The system of claim 1, wherein the first and second pressurized load ports protrude from a region outlined by a workstation body wall.

5. The system of claim 1, wherein the first load port and the second load port each comprises a chamber that is at the set pressure level when a door between the chamber and the workstation body is open.

6. The system of claim 1, further comprising a sorter at the set pressure level and configured to provide a buffering space for work in progress semiconductor workpieces.

7. The system of claim 1, wherein the set pressure level is $10^{-1}$ Torr to $10^{-3}$ Torr.

8. A system, comprising:
    first, second and third pressurized load ports each set at a set pressure level;
    a workstation body maintained at the set pressure level, wherein the workstation body comprises an internal material handling system configured to move a semiconductor workpiece within the workstation body between the first, second and third load ports;
    a first modular tool configured to process the semiconductor workpiece, wherein the first modular tool has only a single chamber interfaced with the first and second pressurized load ports, and wherein the first pressurized load port is used for a first application and the second pressurized load port is used for a second application different from the first application; and
    a second modular tool configured to inspect the semiconductor workpiece processed by the first modular tool, wherein the second modular tool has only a single chamber interfaced with the first, second and third pressurized load ports.

9. The system of claim 8, further comprising a fourth pressurized load port, wherein the third pressurized load port is used for a third application and the fourth pressurized load port is used for a fourth application different from the third application.

10. The system of claim 8, further comprising a first transportation platform having a plurality of wheels extending from a bottom surface thereof and configured to transport the first modular tool to interface with the workstation body or disengage from the workstation body.

11. The system of claim 10, further comprising a second transportation platform having a plurality wheels extending from a bottom surface thereof and configured to transport the second modular tool to interface with the workstation body or disengage from the workstation body.

12. The system of claim 9, wherein the first, second, third and fourth pressurized load ports each comprise a chamber between a first door and a second door, wherein only one door is configured to be open at any time.

13. The system of claim 9, further comprising a fifth pressurized load port interfaced with an external material handling system, the external material handling system at a second pressure level different than the set pressure level.

14. The system of claim 8, further comprising a sorter set at the set pressure level and configured to provide a buffering space for work in progress semiconductor workpieces.

15. The method of claim 8, wherein the set pressure level is less than a standard atmosphere (atm).

16. A system, comprising:
    a workstation body maintained at a set pressure level;
    first, second, third and fourth pressurized load ports each interfaced with the workstation body, wherein the workstation body comprises an internal material handling system configured to move a semiconductor workpiece within the workstation body between the first, second, third and fourth pressurized load ports at the set pressure level;
    a first modular tool configured to process the semiconductor workpiece, the first modular tool having only a single chamber interfaced with the first and second pressurized load ports, wherein the first pressurized load port is used for a first application and the second pressurized load port is used for a second application different from the first application; and
    a second modular tool configured to receive and process the semiconductor workpiece from the first modular tool, the second modular tool having only a single chamber interfaced with the third and fourth pressurized load ports, wherein the third pressurized load port is used for a third application and the fourth pressurized load port is used for a fourth application different from the third application, wherein:
    the first pressurized load port is configured to receive the semiconductor workpiece from the processing tool, wherein an air pressure in the first pressurized load port is equalized with a set pressure level; and
    the second pressurized load port is configured to receive the semiconductor workpiece from the first pressurized load port, wherein the second pressurized load port is set at the set pressure level when receiving the semiconductor workpiece from the first pressurized load port and thereafter set to an external air pressure.

17. The system of claim 16, wherein the first, second, third and fourth pressurized load ports each comprise a chamber between a first door and a second door, wherein only one door is configured to be open at any time.

18. The system of claim 16, wherein the fourth pressurized load port is configured to interface with an external material handling system, the external material handling system at a second pressure level different than the set pressure level.

19. The system of claim 16, wherein the set pressure level is less than a standard atmosphere (atm).

20. The system of claim 16, wherein the first, second and third pressurized load ports protrude from a region outlined by a workstation body wall.

* * * * *